United States Patent
Haeberlen et al.

(10) Patent No.: US 9,484,410 B2
(45) Date of Patent: Nov. 1, 2016

(54) LATERAL MOS POWER TRANSISTOR HAVING FRONT SIDE DRAIN ELECTRODE AND BACK SIDE SOURCE ELECTRODE

(71) Applicant: Infineon Technologies AG, Neubiberg (DE)

(72) Inventors: Oliver Haeberlen, Villach (AT); Franz Hirler, Isen (DE); Maximilian Roesch, Villach-St. Ulrich (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/642,638

(22) Filed: Mar. 9, 2015

(65) Prior Publication Data

US 2015/0187879 A1    Jul. 2, 2015

Related U.S. Application Data

(63) Continuation of application No. 13/108,711, filed on May 16, 2011, now Pat. No. 8,975,696.

(30) Foreign Application Priority Data

May 18, 2010  (DE) .................. 10 2010 020 884

(51) Int. Cl.
```
H01L 29/10      (2006.01)
H01L 29/417     (2006.01)
H01L 29/78      (2006.01)
H01L 29/861     (2006.01)
H01L 29/06      (2006.01)
H01L 29/40      (2006.01)
```
(52) U.S. Cl.
CPC ....... *H01L 29/1045* (2013.01); *H01L 29/0649* (2013.01); *H01L 29/0653* (2013.01); *H01L 29/4175* (2013.01); *H01L 29/41775* (2013.01); *H01L 29/7816* (2013.01); *H01L 29/7824* (2013.01); *H01L 29/7833* (2013.01); *H01L 29/7835* (2013.01); *H01L 29/8611* (2013.01); *H01L 29/0626* (2013.01); *H01L 29/1095* (2013.01); *H01L 29/402* (2013.01)

(58) Field of Classification Search
None
See application file for complete search history.

(56) References Cited

U.S. PATENT DOCUMENTS

| | | | | |
|---|---|---|---|---|
| 2010/0155836 | A1* | 6/2010 | Hebert | H01L 21/82348 257/334 |
| 2010/0163979 | A1* | 7/2010 | Hebert | H01L 24/05 257/335 |
| 2011/0210956 | A1* | 9/2011 | Girdhar | H01L 27/088 345/212 |
| 2012/0273878 | A1* | 11/2012 | Mallikarjunaswamy | H01L 29/66681 257/335 |

* cited by examiner

*Primary Examiner* — Michael Jung
(74) *Attorney, Agent, or Firm* — Murphy, Bilak & Homiller, PLLC

(57) ABSTRACT

A semiconductor component may include a semiconductor layer which has a front side and a back side, a first terminal electrode on the front side, a second terminal electrode on the back side, a first dopant region of a first conduction type on the front side, which is electrically connected to one of the terminal electrodes, a second dopant region of a second conduction type in the semiconductor layer, which is electrically connected to the other terminal electrode, a pn junction being formed between the first and second dopant regions, a dielectric layer on the back side between the semiconductor layer and the second terminal electrode, and the dielectric layer having an opening through which an electrical connection between the second terminal electrode and the first or second dopant region is passed.

10 Claims, 6 Drawing Sheets

LATERAL MOS POWER TRANSISTOR HAVING FRONT SIDE DRAIN ELECTRODE AND BACK SIDE SOURCE ELECTRODE

RELATED APPLICATIONS

This application claims priority of German Patent Application No. 102010020884.1, which was filed on May 18, 2010. The entire contents of the German Patent Application are hereby incorporated herein by reference. Furthermore, this Application is a Continuation Application of copending U.S. patent application Ser. No. 13/108,711(now U.S. Pat. No. 8,975,696), which was filed on May 16, 2011. The entire contents of the indicated copending US Patent Application are hereby incorporated herein by reference.

FIELD OF THE INVENTION

Exemplary embodiments of the present invention may relate to a semiconductor component having one terminal electrode on a front side of a semiconductor layer and having a further terminal electrode on the back side of the semiconductor layer, and a pn junction formed in the semiconductor layer.

BACKGROUND

Avoiding or suppressing stray properties is often the goal of development work for semiconductor components. Particularly in the case of power semiconductor components, stray capacitances are often undesired.

In order to avoid for example undesired gate-drain capacitances, a lateral DMOS may be produced which achieves very good control of the gate-drain overlap region, and therefore the gate-drain capacitance, by way of self-aligned implantation of the LDD region at the gate electrode. The drain or the source is connected to the back side by way of a sinker. This leads to an increased output capacitance which results from the body region at source potential forming a pn junction both vertically with the drain sinker and laterally with the substrate at drain potential.

SUMMARY

Embodiments of the invention relate in general to a semiconductor component, in particular a power semiconductor component, comprising a semiconductor layer which has a front side and an opposite back side, a first terminal electrode on the front side of the semiconductor layer, a second terminal electrode on the back side of the semiconductor layer, a first dopant region of a first conduction type on the front side in the semiconductor layer, which is electrically connected to one of the terminal electrodes, a second dopant region of a second conduction type in the semiconductor layer, which is electrically connected to the other terminal electrode, a pn junction being formed between the first and second dopant regions, and a dielectric layer on the back side of the semiconductor layer between the semiconductor layer and the second terminal electrode, the dielectric layer having an opening through which an electrical connection between the second terminal electrode and the first or second dopant region is passed.

DETAILED DESCRIPTION

Exemplary embodiments of the invention will be explained in more detail below with reference to the appended figures. The invention is not however restricted to the embodiments specifically described, but may be modified and adapted in a suitable way. It is within the scope of the invention to combine individual features and feature combinations of one embodiment suitably with features and feature combinations of another embodiment, in order to obtain other embodiments according to the invention.

Before the exemplary embodiments of the present invention are explained in more detail below with reference to the figures, it will be pointed out that elements which are the same in the figures are provided with identical or similar references and repeated description of these elements is omitted. Furthermore, the figures are not necessarily true to scale; rather, the focus is on explaining the basic principle.

Figure 1:
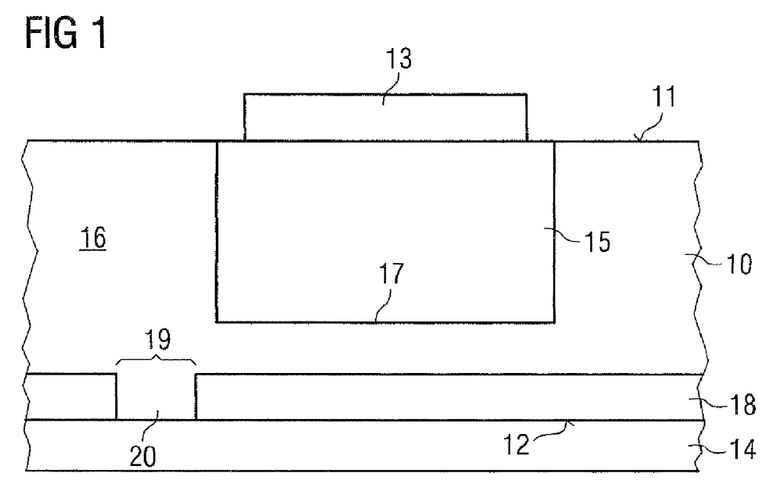
FIG. 1 shows in a schematic cross-sectional view an embodiment of a semiconductor component having a dielectric layer between a pn junction and a backside terminal electrode.

FIG. 1 shows a semiconductor component in a schematic cross-sectional view. The exemplary embodiment comprises a semiconductor layer 10 having a front side 11 and back side 12. Here and in what follows, the front side 11 is intended to mean the side of the semiconductor layer 10 on which implantations or diffusions of dopants into the semiconductor layer 10 are carried out in order to form active component structures, or on which a possible epitaxial layer is grown. The back side 12 refers to the opposite side of the semiconductor layer 10 from the front side 11. The semiconductor layer 10 may consist of any known semiconductor material. On the front side 11 of the semiconductor layer 10, a first terminal electrode 13 is applied which is electrically connected to a first dopant region 15 of a first conduction type. The p- or n-doped first dopant region 15 is arranged on the front side 11 in the semiconductor layer 10, the first terminal electrode 13 being arranged directly on the surface of the first dopant region. On the back side 12 of the semiconductor layer 10, a second terminal electrode 14 is arranged which is electrically connected to a second dopant region 16 of a second conduction type, complementary to the first dopant region 15. The second dopant region 16 likewise lies in the semiconductor layer 10, the second dopant region forming either a part of the semiconductor layer 10 or the entire remainder of the semiconductor layer 10 apart from the first dopant region. Between the first dopant region 15 and the second dopant region 16, a pn junction 17 is formed in the semiconductor layer 10. On the back side 12 of the semiconductor layer 10, a dielectric layer 18 is arranged between the semiconductor layer 10 and the second terminal electrode 14, the dielectric layer 18 having an opening 19 through which an electrical connection 20 between the second terminal electrode 14 and the second dopant region 16 is passed. The electrical connection 20 in the present exemplary embodiment is formed by a part of the semiconductor layer 10 continued in the opening 19 as far as the second terminal electrode 14.

Figure 2:
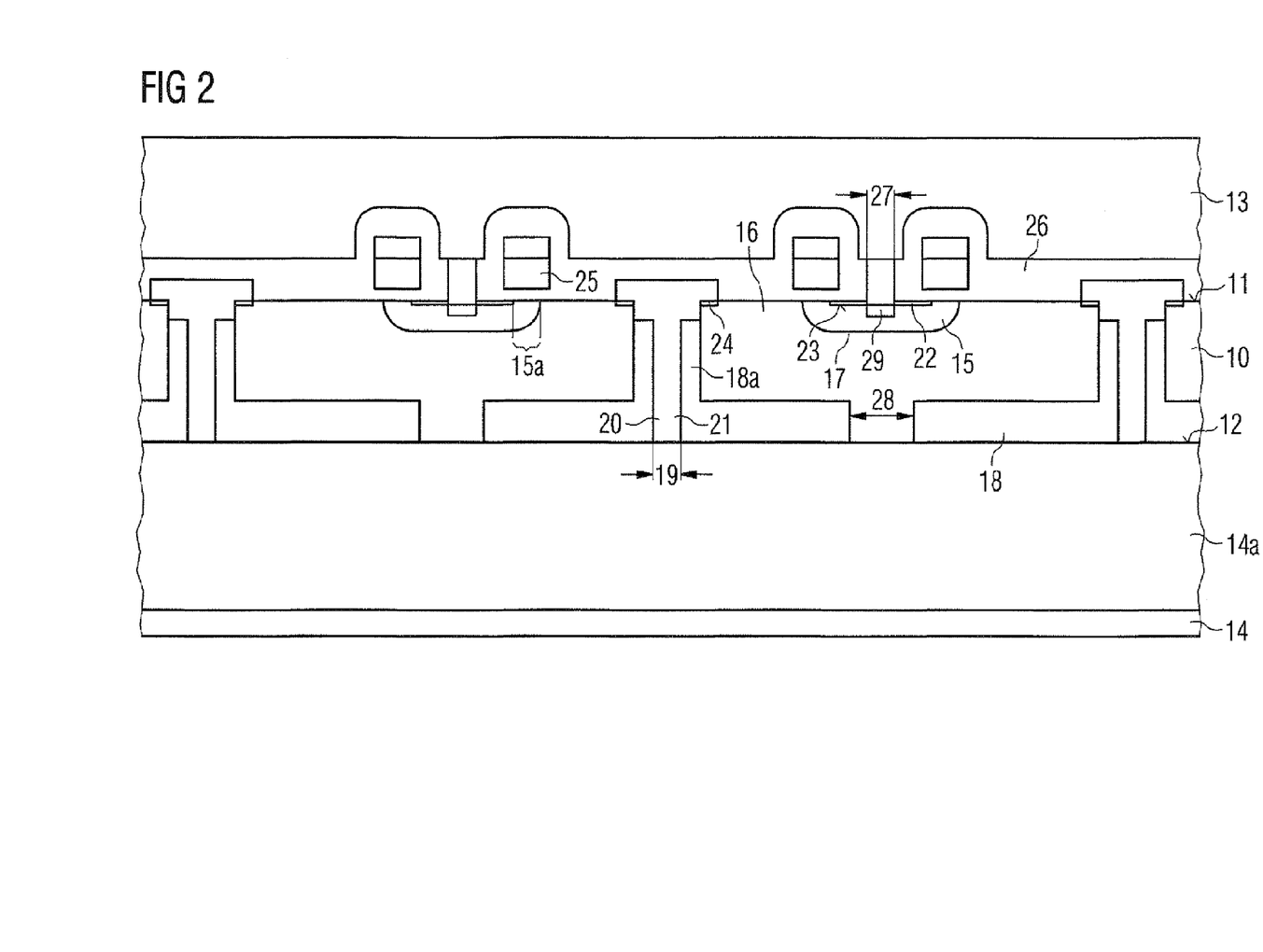
FIG. 2 shows in a schematic cross-sectional view an embodiment of a lateral MOS power semiconductor transistor having a backside drain terminal.

FIG. 2 shows a possible alternative embodiment of a semiconductor component. The semiconductor component constitutes a lateral MOS power transistor, which has a backside drain terminal. In FIG. 2, a plurality of identical semiconductor components of this type are shown next to one another in a semiconductor layer 10. Each of these lateral MOS power transistors has, in the semiconductor layer 10, a first dopant region 15 of a first conduction type as a body region, a second dopant region 16 of a second conduction type as a drift section and a third dopant region 22 of a second conduction type as a source region, one pn junction 17 being formed between the drift section and the body region and a further pn junction 23 being formed between the body region and the source region. The two pn junctions 17 and 23 are respectively arranged as far as a frontside surface of the semiconductor layer 10. Over a channel region 15a in the body region 15, between the two pn junctions 17 and 23, a control electrode 25 is applied on the front side 11 of the semiconductor layer 10 so that, when a control voltage is applied to the control electrode, an electrically conductive channel can be formed inside the channel region along the surface of the semiconductor layer 10 between the source region 22 and the drift section 16. The control electrode 25 (gate electrode) is separated from the channel region 15a by a thin gate dielectric. In one embodiment, the control electrode 25 may be composed of a plurality of electrically conductive layers.

The source region 22, introduced for example by diffusion of a dopant on the front side 11 of the semiconductor layer 10 into the semiconductor layer 10, and the body region 15 are electrically connected together in this exemplary embodiment to the terminal electrode 13 on the front side 11 of the semiconductor layer 10. Both the source region 22 and the body region 15 are thus at source potential. The terminal electrode 13 is electrically insulated from the semiconductor layer 10 and the gate electrode 25 in wide parts by way of a dielectric layer 26. Only above a terminal zone 29 in the semiconductor layer 10, which is provided in order to connect the source region 22 and the body region 15 to the terminal electrode 13 and which in general is more heavily doped than the semiconductor regions to be connected, is an opening 27 provided inside the dielectric layer 26, through which an electrical connection is established between the terminal electrode 13 and the semiconductor layer 10.

The second terminal electrode 14, for the drain terminal of the MOS power transistor, lies on the back side 12 of the semiconductor layer 10. Between the semiconductor layer 10 and the terminal electrode 14 lies the dielectric layer 18 and additionally, in this exemplary embodiment, a further doped semiconductor region 14a. The further doped semiconductor region 14a has in general a low electrical resistance, in order to establish a good electrical connection between the drift section 16 and the terminal electrode 14. For this reason, the semiconductor region 14a should have a dopant concentration of more than $5 \times 10^{17}$ cm-3.

As can be seen in FIG. 2, in the lateral MOS power transistor the flow of current is provided along the front side 11 surface of the semiconductor layer 10 from the source region 22 through the channel region 15a and along the drift section 16 to a contact region 24. The contact region 24 is arranged on the front side 11 of the semiconductor layer 10 within the drift section 16. The contact region 24 is used for electrical contact between a low-impedance electrical connection line 21, which extends from the front side 11 to the back side 12 of the semiconductor layer 10, and the drift section 16. The electrical connection line 21 is electrically connected through the opening 19 inside the dielectric layer 18 either directly to the terminal electrode 14 or, as in the present case, to the further doped semiconductor region 14a, and therefore constitutes a part of a low-impedance electrical conduction path from the front side 11 of the semiconductor layer 10 to the backside terminal electrode 14. The electrical connection line 21 is either a heavily doped semiconductor material of the same conduction type as the drift section and introduced for example in the polycrystalline state, or another highly conductive material, for example a metal.

In order to avoid stray capacitances, a dielectric layer 18a is advantageously formed at least partially outside the contact region 24 between the body region 15, or the source region 22, and the low-impedance electrical connection line 21. In the exemplary embodiment of a lateral MOS power transistor represented in FIG. 2, a further opening 28 is optionally furthermore provided in the dielectric layer 18 on the back side 12 of the semiconductor layer 10. This further opening 28 is provided below the terminal zone 29, i.e. on the shortest path between the terminal zone 29 and the backside terminal electrode 14. Through this further opening 28 in the dielectric layer 18, an electrical connection is formed from the drift section 16 to the second terminal electrode 14 or, if present, to the further semiconductor region 14a. The opening 28 may be filled with the semiconductor material of the drift section 16 in order to establish this electrical connection. A breakdown point for a possibly occurring avalanche breakdown within the component can be defined by this opening. It is particularly advantageous for the further opening 28 not to lie under the channel region 15a. The injection of so-called "hot" charge carriers into the gate dielectric in the event of an avalanche breakdown is therefore prevented.

Figure 3:
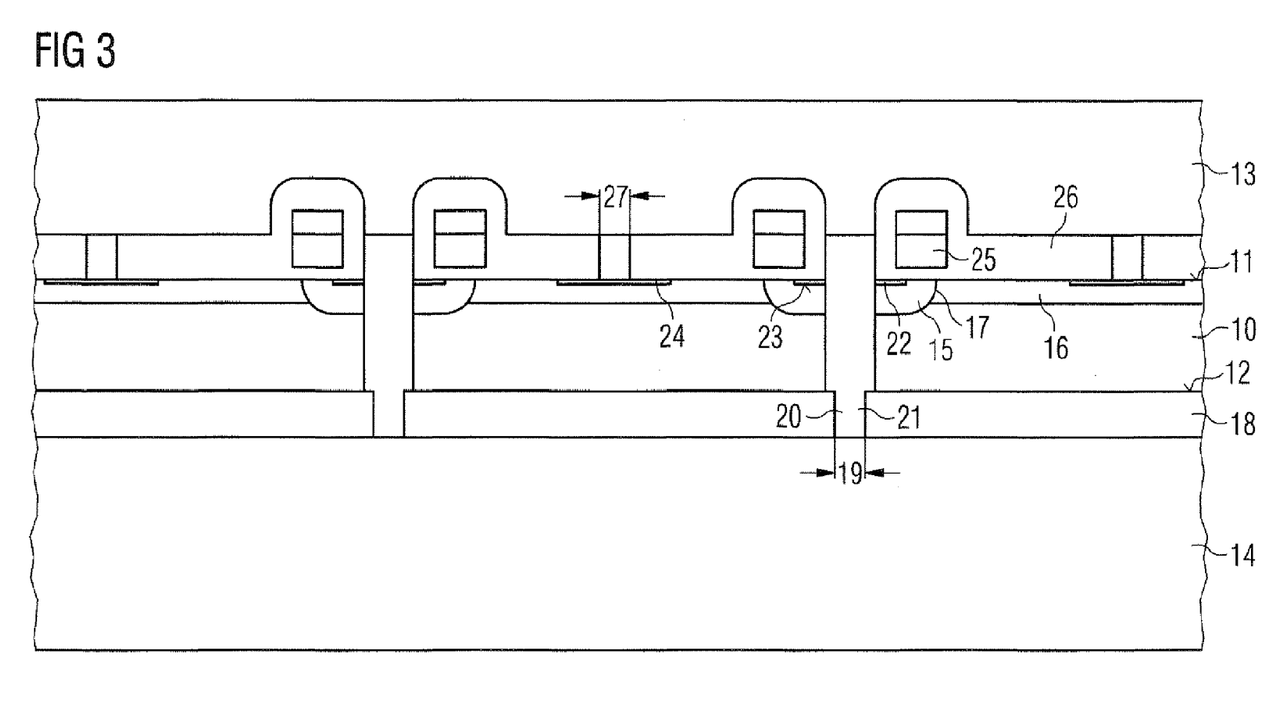
FIG. 3 shows in a schematic cross-sectional view an embodiment of a lateral MOS power semiconductor transistor having a "source-down" structure.

FIG. 3 represents another possible embodiment of a lateral MOS semiconductor power transistor. As in FIG. 2, a plurality of identical MOS power transistors are shown next to one another in FIG. 3. Each MOS power transistor is formed in a common semiconductor layer 10 and has a first dopant region 15 of a first conduction type as a body region, a second dopant region 16 of a second conduction type as a drift section and a third dopant region 22 of a second conduction type as a source region. In contrast to the exemplary embodiment of FIG. 2, an MOS semiconductor transistor in FIG. 3 is formed with a so-called "source-down structure." That is to say the source terminal of the MOS semiconductor transistor lies on the back side 12 of the semiconductor layer 10 while the drain terminal is applied on the front side 11. The respective terminal electrodes 13 and 14 for the source and drain are separated from the semiconductor layer 10 by the dielectric layers 18 and 26. The electrical connection 20 between the source region 22 on the front side 11 and the source terminal electrode 14 on the back side 12 is made by way of an electrical connection line 21 from the terminal electrode 14 through an opening 19 in the backside dielectric layer 18 to the source region 22 on the front side 11. The drain contact region 24, drift section 16, body region 15 and source region 22 are arranged on the front side of the semiconductor layer 10 in the lateral direction. The back side 12 of the semiconductor layer 10 is weakly p-doped. The drain contact region 24 is electrically connected to the drain terminal electrode 13 on the front side 11 through an opening 27 in the front side dielectric layer 26.

Figure 4:
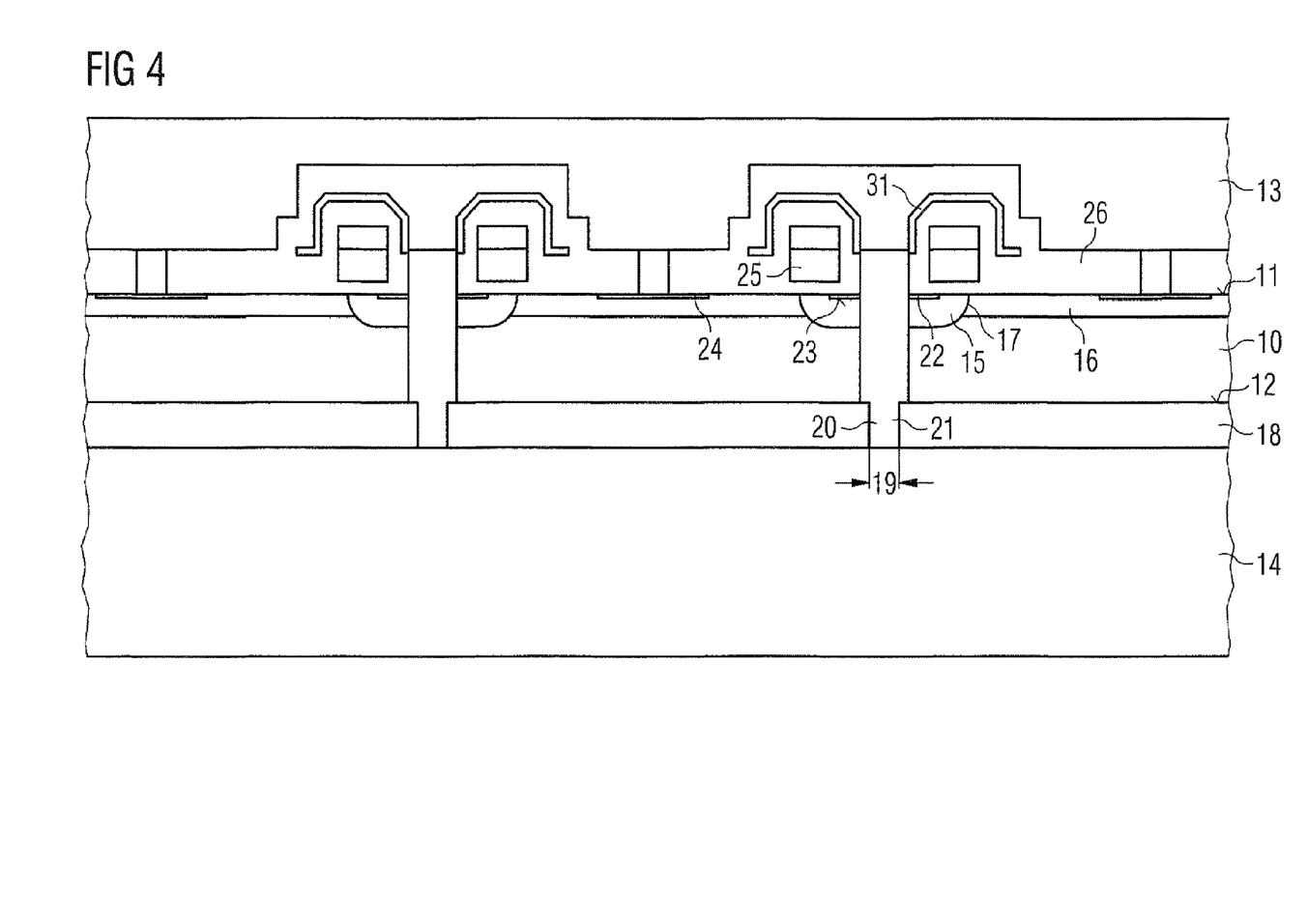
FIG. 4 shows in a schematic cross-sectional view an embodiment of a lateral MOS power semiconductor transistor having a "source-down" structure and gate screening.

FIG. 4 shows an exemplary embodiment of a "source-down" transistor according to FIG. 3 in which screening 31, including for example titanium/titanium nitride and connected to the source region 22, is arranged over the gate electrode 25. The screening 31 lies for example, as represented, between the gate electrode 25 and the source terminal electrode 13, inside the dielectric layer 26.

Figure 5:
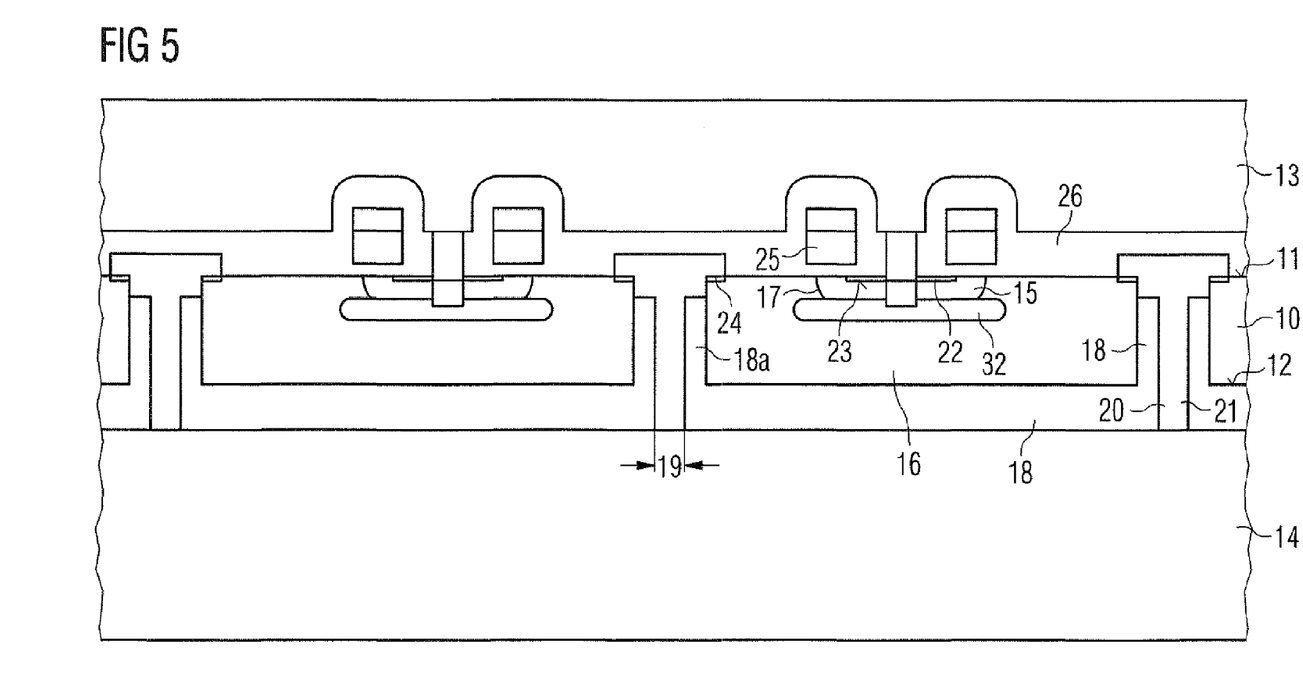
FIG. 5 shows in a schematic cross-sectional view an embodiment of a lateral MOS power semiconductor transistor having a backside drain terminal and a buried p-plate under the channel.

FIG. 5 represents another exemplary embodiment of a lateral MOS power transistor with a back side drain terminal, as has already been explained with reference to FIG. 2. In contrast to the exemplary embodiment of FIG. 2, the present variant does not however have a further opening 28 in the back side dielectric layer 18. Instead, a fourth dopant region 32 of the first conduction type, for example a p-conductive region, which is connected to the source terminal electrode 13, is also arranged below the body region 15 in the second dopant region 16. This fourth dopant region 32 extends below the body region 15 laterally beyond the edges of the body region 15 in the direction of the drain contact region 24. A heavier dopant concentration of this fourth dopant region 32, compared with the body region 15, causes a displacement of a possibly occurring avalanche breakdown away from the channel region 15a towards the fourth dopant region 32. The breakdown thus takes place on the edge of the fourth dopant region 32 lying closest to the drain contact region 24.

Figure 6:
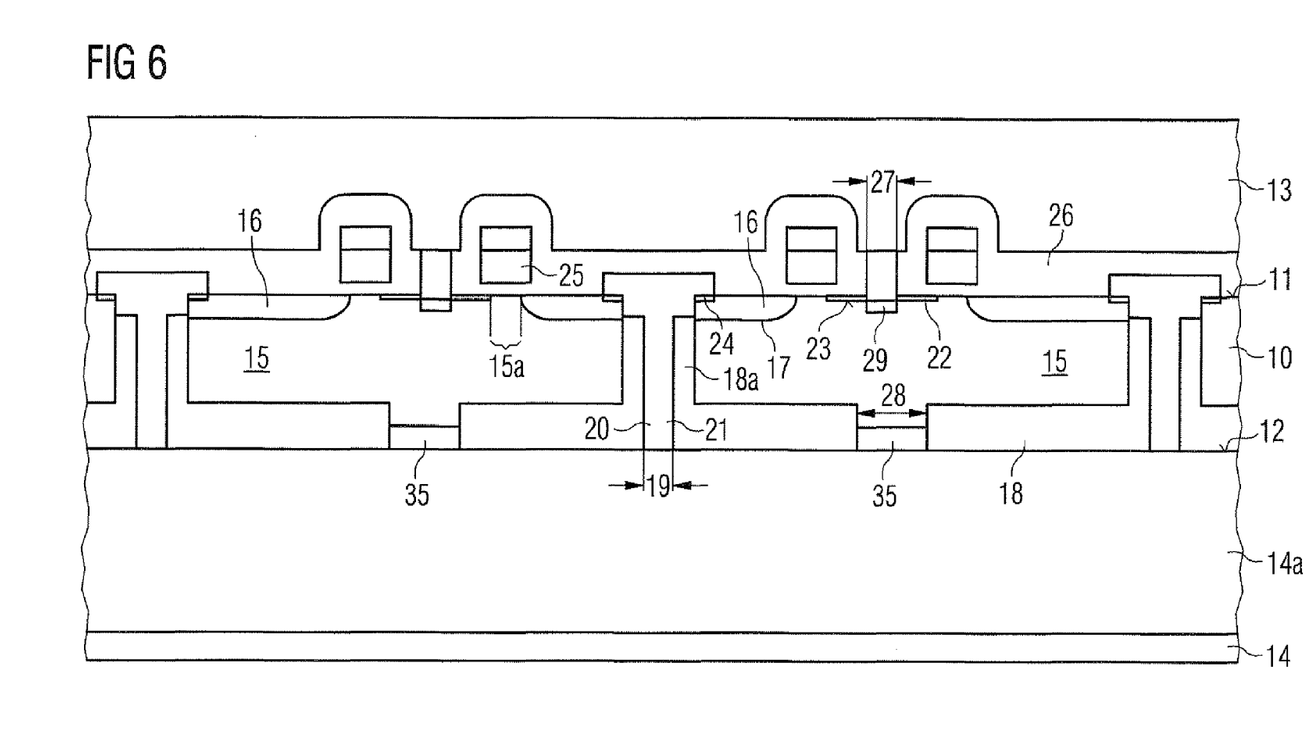
FIG. 6 shows in a schematic cross-sectional view another embodiment of a lateral MOS power semiconductor transistor having a backside drain terminal.

FIG. 6 shows another alternative embodiment of a lateral MOS power transistor which has a back side drain terminal, as also already represented in FIG. 2.

In contrast to the embodiment of FIG. 2, in the exemplary embodiment of FIG. 6 the body region 15 of the MOS power transistor is formed by the semiconductor material of the original, for example epitaxially produced semiconductor layer 10, whereas the drift section 16 on the front side 11 of the semiconductor layer 10 is formed by diffusion of a dopant of a conduction type complementary to the body region 15 into the semiconductor layer 10.

In the exemplary embodiment shown, a dopant region 35 with doping of the same conduction type as the contact region 24 and the drift section 16 is formed in the semiconductor layer 10, in the opening 28 on the back side 12 of the semiconductor layer 10, for electrical connection between the semiconductor layer 10 and the second terminal electrode 14.

Owing to the dielectric layer shown in the embodiments, for example, the stray capacitance of the pn junction is reduced because the space charge zone built up in the off state when applying an off-state voltage to the pn junction is limited by the dielectric layer, i.e. there is a greater voltage drop across the dielectric layer than in the semiconductor layer. Preferably, the dielectric layer is therefore placed as close as possible to the pn junction in order to restrict the extent of the space charge zone as much as possible, i.e. achieve as high as possible a voltage drop inside the dielectric layer, so as to reduce the stray capacitance. Typical distances from the dielectric layer to the pn junction are accordingly less than the extent of a space charge zone with an applied off-state voltage in the semiconductor material on one side of the pn junction. In order to be able to carry a load current through the semiconductor component in spite of this, a current path through the dielectric layer must be opened. This current path leads through the opening in the dielectric layer, so that the load current can be carried from one side of the semiconductor component to the opposite side.

In a refinement of the semiconductor component, the electrical connection through the opening in the dielectric layer is formed by way of a low-impedance electrical connection line. Owing to the low impedance, good electrical conduction of the current through the semiconductor component can be achieved. Electrical power losses can thereby be avoided.

In one exemplary embodiment, the low-impedance electrical connection line extends from the front side to the back side of the semiconductor layer. The semiconductor component can therefore be formed essentially on the front side of the semiconductor layer while the current can nevertheless be delivered or taken off on the back side of the semiconductor layer. For example, lateral MOS transistors can be formed by configuration on the front side. Owing to the lateral alignment, more accurate or reduced overlap regions of the semiconductor component, and therefore lower stray capacitances, can be set intrinsically by production owing to "self-aligned" implantations on the front side of the semiconductor layer.

In another embodiment, the semiconductor component has a third dopant region of a second conduction type in the semiconductor layer, a further pn junction being formed between the third dopant region and the first dopant region, and the third dopant region being electrically connected to the same terminal electrode as the second dopant region. An MOS transistor can therefore be produced as a semiconductor component.

In one embodiment, the second dopant region is electrically connected to the first terminal electrode and the first and third dopant regions are electrically connected to the second terminal electrode. A "source-down" component can thereby be produced.

According to another embodiment, the second dopant region is electrically connected to the second terminal electrode and the first and third dopant regions are electrically connected to the first terminal electrode. This is the normal terminal configuration of a power transistor having a backside drain terminal and a frontside source terminal.

According to one exemplary embodiment, the first dopant region has a contact region on the front side of the semiconductor layer for an electrical contact with the low-impedance electrical connection line, and a dielectric layer is formed at least partially outside the contact region between the first dopant region and the low-impedance electrical connection line. In this way, the stray drain-source capacitance can additionally be reduced.

In a refinement of the semiconductor component, a further dielectric layer is arranged between the semiconductor layer and the first terminal electrode, the further dielectric layer having an opening through which an electrical connection between the first terminal electrode and the first or second dopant region is passed. This allows problem-free formation of the terminal electrode over a large area on the front side of the semiconductor layer.

In one exemplary embodiment of the semiconductor component, a control electrode is applied on the front side of the semiconductor layer over a channel region in the first dopant region so that an electrically conductive channel can be formed in the channel region between the second dopant region and the third dopant region when a control voltage is applied to the control electrode.

According to another exemplary embodiment of the semiconductor component, the third dopant region has a terminal zone for the first terminal electrode, and a further opening with an electrical connection of the semiconductor layer to the second terminal electrode is formed in the dielectric layer on the back side of the semiconductor layer below the terminal zone. An improved breakdown behaviour of the semiconductor component in the event of an avalanche breakdown can thereby be achieved. In particular, by suitable placement of the further opening in such a way that the further opening in the dielectric layer on the back side of the semiconductor layer does not lie under the channel region, the breakdown point of the semiconductor component can be set so that the injection of so-called "hot" charge carriers, i.e. highly energetic charge carriers, into the gate oxide of an MOS transistor is prevented.

In one embodiment of the semiconductor component, a further doped semiconductor region is arranged between the dielectric layer and the second terminal electrode. This has manufacturing technology advantages because the growth of an epitaxial semiconductor layer is made possible by the preferably monocrystalline doped semiconductor region. It is possible to produce the structure of the semiconductor component in particular by lateral epitaxial growth of a dielectric layer produced on the doped semiconductor region.

In one embodiment, at least the dielectric layer on the back side has a lower dielectric constant k than the semiconductor material of the semiconductor layer. A reduction of the stray capacitances can thereby be achieved. The dielectric layer is, for example, formed at least partially as an oxide layer or as a cavity.

What is claimed is:

1. A lateral MOS power transistor, comprising:
   a semiconductor layer which has a front side and an opposite back side,
   a drain electrode on the front side of the semiconductor layer,
   a source electrode on the back side of the semiconductor layer,
   a first dopant region of a first conduction type on the front side in the semiconductor layer, which is electrically connected to the source electrode,
   a second dopant region of a second conduction type in the semiconductor layer, which is electrically connected to the drain electrode,
   a pn junction being formed between the first and second dopant regions, and
   a dielectric layer on the back side of the semiconductor layer between the semiconductor layer and the source electrode, the dielectric layer having an opening through which an electrical connection between the source electrode and the first dopant region is passed.

2. The lateral MOS power transistor according to claim 1, wherein the electrical connection through the opening in the dielectric layer is formed by way of a low-impedance electrical connection line.

3. The lateral MOS power transistor according to claim 2, wherein the low-impedance electrical connection line extends from the front side to the back side of the semiconductor layer.

4. The lateral MOS power transistor according to claim 1, further comprising a third dopant region of the second conduction type in the semiconductor layer, a further pn junction being formed between the third dopant region and the first dopant region, and the third dopant region being electrically connected to the source electrode.

5. The lateral MOS power transistor according to claim 4, wherein the third dopant region is disposed in the first dopant region, and wherein the electrical connection between the source electrode and the first dopant region passes through the first dopant region to the third dopant region.

6. The lateral MOS power transistor according to claim 1, wherein a further dielectric layer is arranged between the semiconductor layer and the drain electrode, the further dielectric layer having an opening through which an electrical connection between the drain electrode and the second dopant region is passed.

7. The lateral MOS power ransistor according to claim 4, further comprising a gate electrode disposed above the front side of the semiconductor layer and a screening arranged over the gate electrode and electrically connected to the third dopant region.

8. The lateral MOS power transistor according to claim 7, wherein the screening is disposed in an additional dielectric layer disposed on the front side of the semiconductor layer.

9. The lateral MOS power transistor according to claim 8, wherein the electrical connection between the source electrode and the first dopant region passes into the additional dielectric layer and contacts the screening.

10. The lateral MOS power transistor according to claim 1, wherein the pn junction is positioned over and separated from the drain electrode, and the electrical connection is disposed at least between the pn junction and the drain electrode.

* * * * *